(12) United States Patent
Kim et al.

(10) Patent No.: US 9,240,331 B2
(45) Date of Patent: Jan. 19, 2016

(54) SEMICONDUCTOR DEVICE AND METHOD OF MAKING BUMPLESS FLIPCHIP INTERCONNECT STRUCTURES

(71) Applicant: STATS ChipPAC, Ltd., Singapore (SG)

(72) Inventors: KyungMoon Kim, Gyeonggi-do (KR); KooHong Lee, Seoul (KR); JaeHak Yee, Seoul (KR); YoungChul Kim, Kyoungki-do (KR); Lan Hoang, San Jose, CA (US); Pandi C. Marimuthu, Singapore (SG); Steve Anderson, San Ramon, CA (US); See Chian Lim, Singapore (SG); HeeJo Chi, Kyoungki-do (KR)

(73) Assignee: STATS ChipPAC, Ltd., Singapore (SG)

( * ) Notice: Subject to any disclaimer, the term of this patent is extended or adjusted under 35 U.S.C. 154(b) by 126 days.

(21) Appl. No.: 14/039,418

(22) Filed: Sep. 27, 2013

(65) Prior Publication Data

US 2014/0175661 A1    Jun. 26, 2014

Related U.S. Application Data

(60) Provisional application No. 61/740,395, filed on Dec. 20, 2012.

(51) Int. Cl.
*H01L 23/52* (2006.01)
*H01L 29/40* (2006.01)
(Continued)

(52) U.S. Cl.
CPC ...... *H01L 21/4867* (2013.01); *H01L 23/49811* (2013.01); *H01L 23/49816* (2013.01);
(Continued)

(58) Field of Classification Search
USPC .............. 257/685, 686, 723, 726, 772, 779, 257/E23.015, E23.02, E23.023–E23.079, 257/E21.508–E21.509, E21.519, 774, 787, 257/E23.021, E23.116, 741, E21.295, 257/E23.033, 738, 796; 438/127, 124, 126, 438/109, 121, 106, 15, 613
See application file for complete search history.

(56) References Cited

U.S. PATENT DOCUMENTS 4,509,994 A    4/1985  Barajas
5,172,851 A    12/1992 Matsushita et al.
(Continued)

OTHER PUBLICATIONS

DS Hi-Metal Beyond Materials, DSHM Epoxy Flux EFSCH-026, Technical Data Sheet, Rev2, Aug. 1, 2011, 1 page.
(Continued)

*Primary Examiner* — Dao H Nguyen
*Assistant Examiner* — Tram H Nguyen
(74) *Attorney, Agent, or Firm* — Robert D. Atkins; Patent Law Group: Atkins and Associates, P.C.

(57) ABSTRACT

A semiconductor device includes a substrate with contact pads. A mask is disposed over the substrate. Aluminum-wettable conductive paste is printed over the contact pads of the substrate. A semiconductor die is disposed over the aluminum-wettable conductive paste. The aluminum-wettable conductive paste is reflowed to form an interconnect structure over the contact pads of the substrate. The contact pads include aluminum. Contact pads of the semiconductor die are disposed over the aluminum-wettable conductive paste. The aluminum-wettable conductive paste is reflowed to form an interconnect structure between the contact pads of the semiconductor die and the contact pads of the substrate. The interconnect structure is formed directly on the contact pads of the substrate and semiconductor die. The contact pads of the semiconductor die are etched prior to reflowing the aluminum-wettable conductive paste. An epoxy pre-dot to maintain a separation between the semiconductor die and substrate.

22 Claims, 10 Drawing Sheets

(51) Int. Cl.
*H01L 21/48* (2006.01)
*H01L 23/00* (2006.01)
*H01L 23/498* (2006.01)

(52) U.S. Cl.
CPC ............. *H01L24/17* (2013.01); *H01L 24/81* (2013.01); *H01L 24/05* (2013.01); *H01L 24/16* (2013.01); *H01L 2224/0345* (2013.01); *H01L 2224/0346* (2013.01); *H01L 2224/0381* (2013.01); *H01L 2224/03452* (2013.01); *H01L 2224/0401* (2013.01); *H01L 2224/05567* (2013.01); *H01L 2224/05571* (2013.01); *H01L 2224/05573* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05669* (2013.01); *H01L 2224/05684* (2013.01); *H01L 2224/10165* (2013.01); *H01L 2224/131* (2013.01); *H01L 2224/138* (2013.01); *H01L 2224/13076* (2013.01); *H01L 2224/13294* (2013.01); *H01L 2224/13311* (2013.01); *H01L 2224/13313* (2013.01); *H01L 2224/13316* (2013.01); *H01L 2224/13324* (2013.01); *H01L 2224/13339* (2013.01); *H01L 2224/13344* (2013.01); *H01L 2224/13347* (2013.01); *H01L 2224/13355* (2013.01); *H01L 2224/13794* (2013.01); *H01L 2224/16112* (2013.01); *H01L 2224/16113* (2013.01); *H01L 2224/16225* (2013.01); *H01L 2224/16227* (2013.01); *H01L 2224/1701* (2013.01); *H01L 2224/17517* (2013.01); *H01L 2224/48091* (2013.01); *H01L 2224/73265* (2013.01); *H01L 2224/81007* (2013.01); *H01L 2224/8114* (2013.01); *H01L 2224/81022* (2013.01); *H01L 2224/81192* (2013.01); *H01L 2224/81201* (2013.01); *H01L 2224/81203* (2013.01); *H01L 2224/81424* (2013.01); *H01L 2224/81815* (2013.01); *H01L 2224/81986* (2013.01); *H01L 2924/00014* (2013.01); *H01L 2924/01322* (2013.01); *H01L 2924/12041* (2013.01); *H01L 2924/1306* (2013.01); *H01L 2924/13091* (2013.01); *H01L 2924/15311* (2013.01); *H01L 2924/181* (2013.01)

(56) References Cited

U.S. PATENT DOCUMENTS

| | | |
|---|---|---|
| 5,346,118 A | 9/1994 | Degani et al. |
| 5,564,617 A | 10/1996 | Degani et al. |
| 5,817,545 A | 10/1998 | Wang et al. |
| 6,324,069 B1 | 11/2001 | Weber |
| 7,087,458 B2 | 8/2006 | Wang et al. |
| 7,772,032 B2* | 8/2010 | Kurita .................. B23K 1/0016 228/175 |
| 8,071,470 B2 | 12/2011 | Khor et al. |
| 8,835,301 B2* | 9/2014 | Choi ........................ H01L 24/03 257/737 |
| 8,921,221 B2* | 12/2014 | McLeod et al. .......... B23K 1/20 257/E21.508 |
| 2002/0155637 A1* | 10/2002 | Lee .......................... H01L 24/10 438/108 |
| 2008/0157328 A1* | 7/2008 | Kawata .................. H01L 21/561 257/686 |
| 2009/0206480 A1 | 8/2009 | Lam |
| 2010/0171207 A1* | 7/2010 | Shen .................... H01L 21/4853 257/686 |
| 2010/0314745 A1* | 12/2010 | Masumoto ........ H01L 23/49811 257/692 |
| 2011/0186973 A1* | 8/2011 | Pagaila ......................... 257/660 |
| 2011/0204505 A1* | 8/2011 | Pagaila ................. H01L 21/568 257/686 |
| 2011/0221055 A1* | 9/2011 | Lin ........................ H01L 21/563 257/692 |
| 2012/0068353 A1* | 3/2012 | Huang .................. H01L 21/561 257/774 |
| 2012/0228749 A1* | 9/2012 | Pagaila ................. H01L 23/147 257/659 |
| 2012/0241955 A1 | 9/2012 | Law et al. |
| 2012/0326297 A1* | 12/2012 | Choi .................... H01L 23/3171 257/737 |
| 2013/0069221 A1* | 3/2013 | Lee .................... H01L 23/49811 257/737 |

OTHER PUBLICATIONS

DS Hi-Metal Beyond Materials, Epoxy Flux Introduction, pp. 1-33.
Alpha Advanced Materials, Low Temperature Processing, ALPHA Low Temperature SMT (Surface Mount Technology) Soldering/Processing, Webpage, http://alphacpmd.com/Products/Solder-Paste/Low-Temperature-Processing, 2013. pp. 1-3.
Superior Flux & Mfg. Co., Material Safety Data Sheet, Superior No. 1265 Paste, Jan. 1, 2012, pp. 1-3.
Superior Flux & Mfg. Co., Superior 1265, Aluminum Paste Flux, 1 page.
Superior Flux & Mfg. Co., Material Safety Data Sheet, Superior AL26-33-75, May 24, 2012, pp. 1-4.
Superior Flux & Mfg. Co., Superior Solder Paste AL-26-33-75, Direct Aluminum Solderpaste Using SN96.5/AG3.5, pp. 1-2.
Avery, William F., Direct Aluminum Soldering Paste, IMAPS Thermal Management 2011 Workshop.
Air Products, Better Process Solutions for Direct Benefits at Test & Assembly, Sep. 13, 2010, pp. 1-24.

* cited by examiner

US 9,240,331 B2

SEMICONDUCTOR DEVICE AND METHOD OF MAKING BUMPLESS FLIPCHIP INTERCONNECT STRUCTURES

CLAIM TO DOMESTIC PRIORITY

The present application claims the benefit of U.S. Provisional Application No. 61/740,395, filed Dec. 20, 2012, which application is incorporated herein by reference.

FIELD OF THE INVENTION

The present invention relates in general to semiconductor devices and, more particularly, to a semiconductor device and method of forming bumpless flipchip interconnect structures.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Semiconductor manufacturers also seek to reduce the cost of producing semiconductor devices while decreasing the time required to produce the devices. Semiconductor manufacturing requires many processing steps, including some steps simply to establish interconnection between semiconductor die and other electronic devices. Each additional process step increases both the cost and time required to produce a semiconductor device. Each processing step also introduces an opportunity for abnormalities to occur in the formation process. The process of forming flipchip interconnections, for example, is relatively time consuming and expensive.

SUMMARY OF THE INVENTION

A need exists for a simple, low cost interconnect structure for flipchip devices. Accordingly, in one embodiment, the present invention is a method of making a semiconductor device comprising the steps of providing a substrate including contact pads, disposing a mask over the substrate, printing aluminum-wettable conductive paste over the contact pads of the substrate, disposing a semiconductor die over the aluminum-wettable conductive paste, and reflowing the aluminum-wettable conductive paste to form an interconnect structure over the contact pads of the substrate.

In another embodiment, the present invention is a method of making a semiconductor device comprising the steps of providing a substrate, disposing a mask over the substrate, depositing an aluminum-wettable conductive paste over the substrate, disposing a semiconductor die over the aluminum-wettable conductive paste, and reflowing the aluminum-wettable conductive paste to form an interconnect structure over the substrate.

In another embodiment, the present invention is a method of making a semiconductor device comprising the steps of providing a substrate, depositing conductive paste on the substrate to form an interconnect structure, and disposing a semiconductor die on the conductive paste.

In another embodiment, the present invention is a semiconductor device comprising a substrate including contact pads. A conductive paste is deposited on the contact pads. A semiconductor die is disposed on the conductive paste.

DETAILED DESCRIPTION OF THE DRAWINGS

Figure 1:
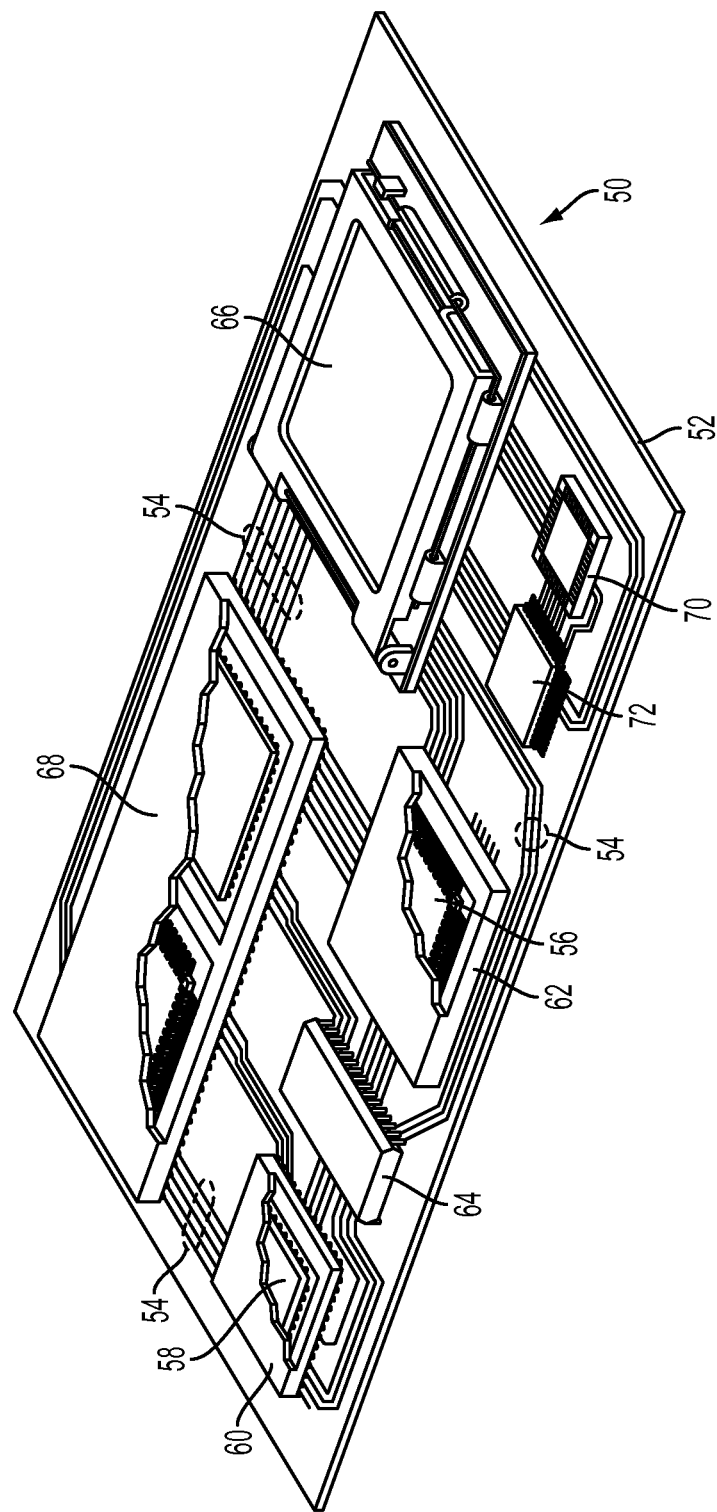
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of the semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
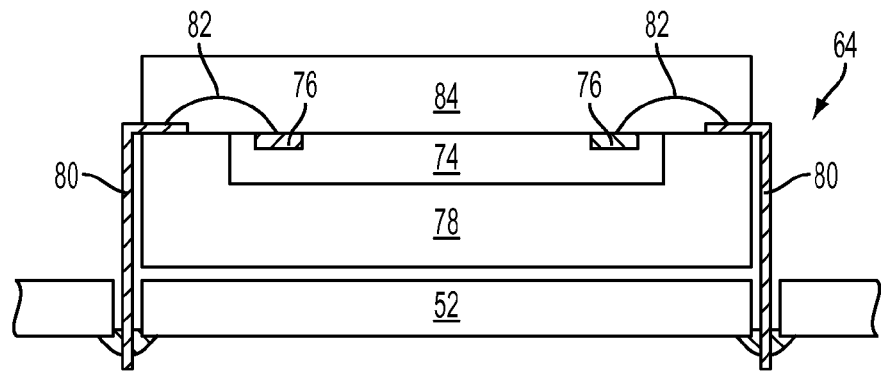
FIGS. 2a-2c illustrate further detail of the representative semiconductor packages mounted to the PCB.
Figure 2B:
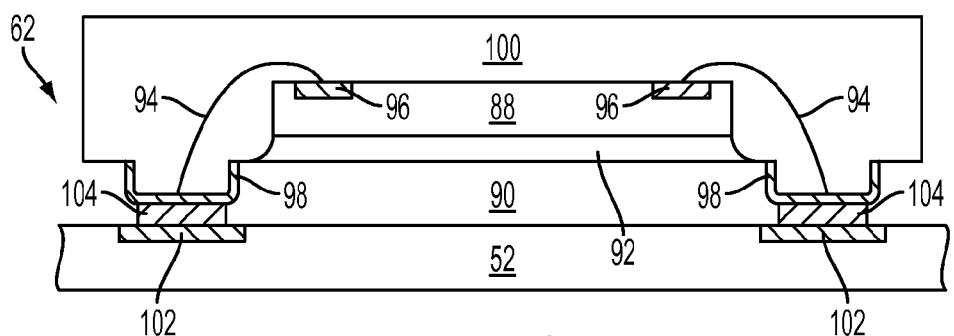
Figure 2C:
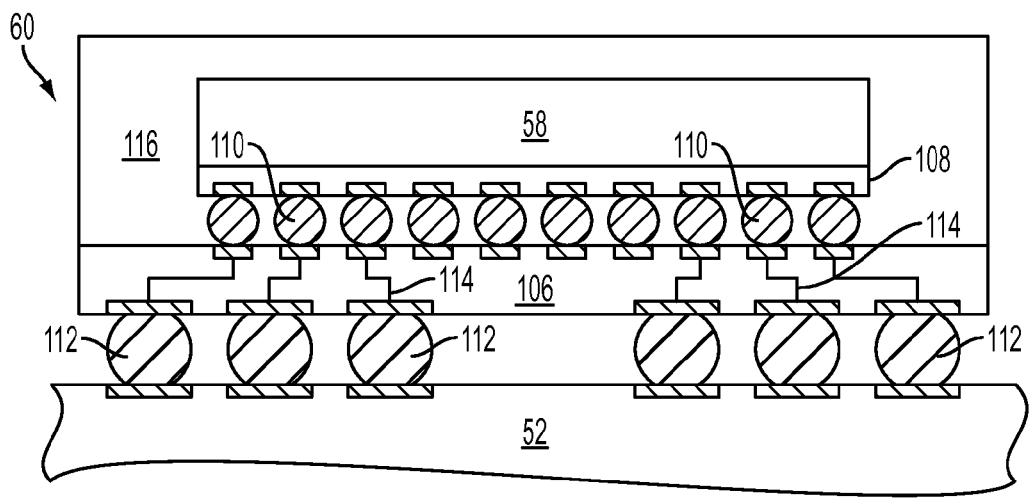

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
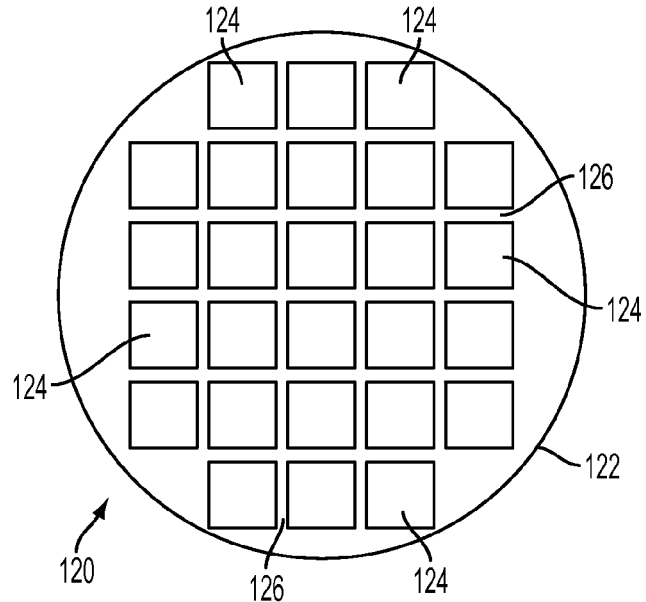
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
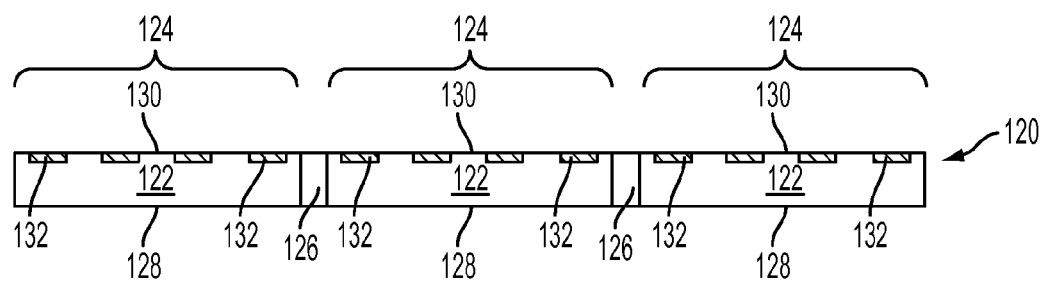

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as a digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, Ti, W, Pd, Pt, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

The active and passive components within semiconductor die 124 undergo testing at the wafer level for electrical performance and circuit function. Each semiconductor die 124 is tested for functionality and electrical parameters using a probe or other testing device. A probe is used to make electrical contact with nodes or contact pads 132 on each semiconductor die 124 and provides electrical stimuli to the contact pads. Semiconductor die 124 responds to the electrical stimuli, which is measured and compared to an expected response to test functionality of the semiconductor die. The electrical tests may include circuit functionality, lead integrity, resistivity, continuity, reliability, junction depth, electrostatic discharge (ESD), radio frequency (RF) performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 3C:
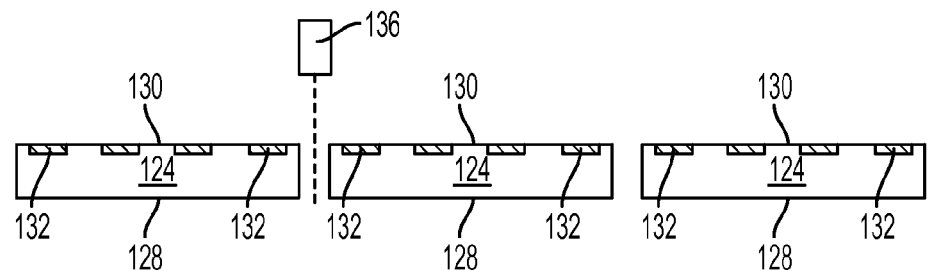

In FIG. 3c, semiconductor wafer 120 is singulated through saw street 126 using a saw blade or laser cutting tool 134 into individual semiconductor die 124. The individual semiconductor die 124 can be inspected and electrically tested for identification of KGD post singulation.

Figure 4A:
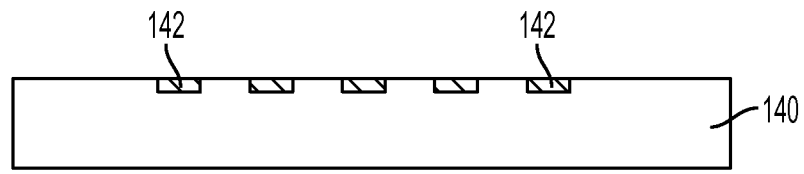
FIGS. 4a-4e illustrate flipchip interconnects formed over a substrate using paste printing directly on contact pads.

FIGS. 4a-4e illustrate forming flipchip interconnects over a substrate using paste printing to mount a semiconductor die over the substrate. In FIG. 4a, substrate 140 includes an electrically conductive layer 142 formed over the substrate using PVD, CVD, electrolytic plating, electroless plating process, or other suitable metal deposition process. Conductive layer 142 can be one or more layers of Al, Cu, Sn, Ni, Au, Ag, Ti, W, Pd, Pt, or other suitable electrically conductive material. Conductive layer 142 operates as contact pads electrically connected to the circuits or traces on substrate 140. Conductive layer 142 can be formed as contact pads disposed side-by-side a first distance from the edge of substrate 140, as shown in FIG. 4a. Alternatively, conductive layer 142 can be formed as contact pads that are offset in multiple rows such that a first row of contact pads is disposed a first distance from the edge of the substrate, and a second row of contact pads alternating with the first row is disposed a second distance from the edge of the substrate. In one embodiment, conductive layer 142 is a contact pad comprising a compound or alloy including aluminum, copper, and silicon that is suitable for bonding with an aluminum-wettable conductive paste or flux.

Figure 4B:
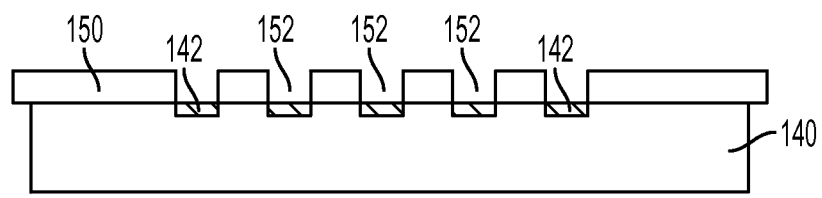

In FIG. 4b, a mask or stencil 150 is disposed over the first surface of substrate 140. Mask 150 can be an insulating layer formed using PVD, CVD, printing, spin coating, spray coating, slit coating, rolling coating, lamination, sintering or thermal oxidation. The mask 150 contains one or more layers of $SiO_2$, $Si_3N_4$, SiON, $Ta_2O_5$, $Al_2O_3$, hafnium oxide ($HfO_2$), benzocyclobutene (BCB), polyimide (PI), polybenzoxazoles (PBO), polymer dielectric resist with or without fillers or fibers, or other material having similar structural and dielectric properties. Alternatively, stencil or mask 150 is formed from Al, Cu, Sn, Ni, Au, Ag, Ti, W, Pd, Pt, or other suitable material by etching, electroforming, or laser cutting to form a continuous mask with openings 152. Mask 150 has openings 152 formed in predetermined locations corresponding to conductive layer 142 of substrate 140. Pre-formed mask 150 is placed over substrate 140 to cover predetermined portions of substrate 140 and expose conductive layer 142 beneath openings 152. In one embodiment, mask 150 has a thickness less than 200 micrometers (μm). Mask 150 can be disposable or reusable for printing over a single substrate or multiple substrates, respectively, and reusable mask 150 should be cleaned between uses to prevent contamination of substrate 140.

Figure 4C:
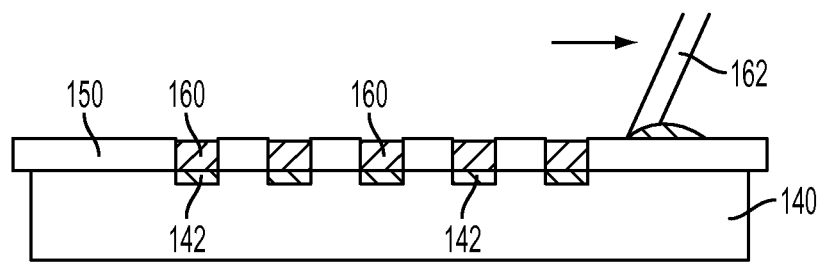

In FIG. 4c, an electrically conductive paste or spreadable conductive material 160 is deposited in openings 152 of mask 150 over conductive layer 142 using a printing process. Squeegee blade 162 or extrusion techniques are used to deposit conductive paste 160 into openings 152. The conductive paste can include Al, Sn, Ni, Au, Ag, Pb, Bi, Cu, solder, and combinations thereof, with an optional flux solution. For example, the paste material can be direct aluminum conductive paste or aluminum-wettable conductive paste. In one embodiment, the conductive paste is an aluminum compound comprising between 97% and 100% aluminum and a combination of silicon, copper, manganese, and chromium for improved bonding directly on aluminum contact pad 142. Conductive paste 160 is applied directly on contact pads or conductive layer 142 to form an electrical interconnection. Printing conductive paste directly on contact pads 142 allows formation of an interconnect structure with reduced cost and improved manufacturing cycle time by eliminating the need for under bump metallization and bump structures.

Figure 4D:
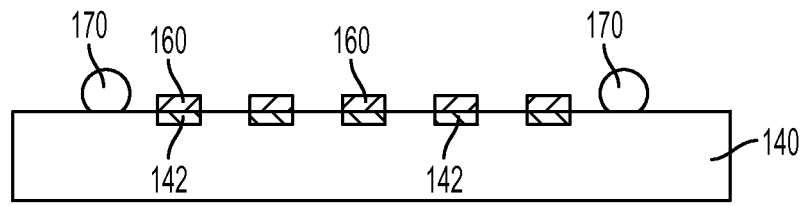

In FIG. 4d, mask 150 is removed from substrate 140 leaving conductive paste 160 over conductive layer 142 of substrate 140. When reusable mask 150 is used, mask 150 is lifted from substrate 140 at a predetermined speed to leave conductive paste 160 over conductive layer 142. Conductive paste 160 is in direct contact with conductive layer 142 of substrate 140. Epoxy pre-dot 170 is formed over a surface of substrate 140 around a perimeter of contact pads 142. Epoxy pre-dot 140 has a predetermined height to maintain standoff distance between substrate 140 and semiconductor die 124 during bonding and prevent interconnect defects.

Figure 4E:
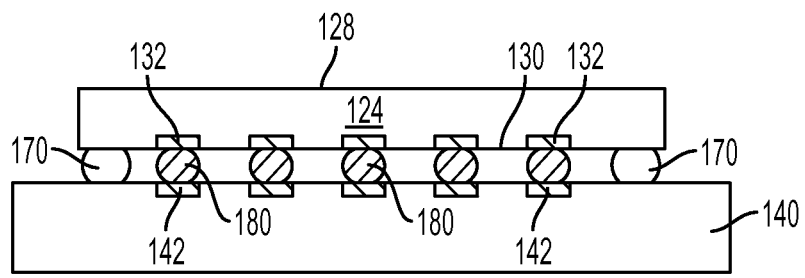

FIG. 4e illustrates flipchip semiconductor die 124 mounted over substrate 140 with contact pads 132 in direct contact with interconnect structure 180. Prior to bonding, contact pads 132 of semiconductor die 124 can be pre-treated with plasma or chemical etching to remove any oxidation, corrosion, or impurities on contact pads 132. In one embodiment, a fluoride-containing aluminum-oxide remover is used to selectively etch and remove any organic or oxidized etch residues and to control the etching of contaminated oxide surfaces. The chemical etch is carried out at ambient temperatures with process times under five minutes using immersion or spray tools. The aluminum-oxide remover has an extremely low etch rate of approximately 4 angstroms (A) per minute on sensitive metals such as Cu, Al, Ti, and W. Etching conductive layer 132 eliminates electro-galvanic corrosion to improve bonding and prevent further corrosion between conductive paste 160 and conductive layer 132.

Semiconductor die 124 is disposed over substrate 140 with conductive layer 132 aligned over conductive layer 142 and conductive paste 160 between conductive layer 132 and conductive layer 142 to electrically connect substrate 140 and contact pad 132. An optional aluminum-wettable conductive paste can be deposited over contact pads 132 of semiconductor die 124 in wafer form in addition to, or instead of, conductive paste 160 over contact pads 142. In one embodiment, the conductive paste is reflowed by heating the material above its melting point to form interconnect structure 180. In some applications, interconnect structure 180 is reflowed a second time to improve electrical contact to conductive layers 132 and 142. Interconnect structure 180 is formed directly on contact pads 132 and 142 by reflowing the aluminum-wettable paste between the semiconductor die 124 and substrate 140. The interconnect structure 180 can also be compression bonded or thermocompression bonded to conductive layers 132 and 142. Epoxy pre-dot 170 contacts a surface of semiconductor die 124 to maintain a standoff distance during bonding and reduce defects in interconnect structure 180.

Interconnect structure 180 is formed directly on contact pads 142 and 132 by printing and reflowing aluminum-wettable conductive paste between semiconductor die 124 and substrate 140 to provide a low-cost interconnect solution. Forming interconnect structure 180 directly on contact pads 142 and 132 eliminates the need to form under bump metallization and bumps over the contact pads of a semiconductor die. The process of forming interconnect structure 180 by paste printing thus provides improved manufacturing cycle time and reduced cost.

Figure 5A:
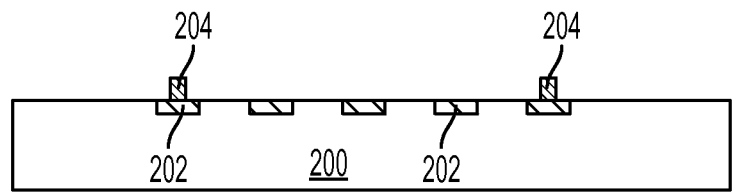
FIGS. 5a-5e illustrate flipchip interconnects formed over a substrate using paste printing directly on contact pads.

FIGS. 5a-5e illustrate forming flipchip interconnects over a substrate using paste printing to mount a semiconductor die over the substrate. In FIG. 5a, substrate 200 includes an electrically conductive layer 202 formed over the substrate using PVD, CVD, electrolytic plating, electroless plating process, or other suitable metal deposition process. Conductive layer 202 can be one or more layers of Al, Cu, Sn, Ni, Au, Ag, Ti, W, Pd, Pt, or other suitable electrically conductive material. Conductive layer 202 operates as contact pads electrically connected to the circuits or traces on substrate 200. Conductive layer 202 can be formed as contact pads disposed side-by-side a first distance from the edge of substrate 200, as shown in FIG. 5a. Alternatively, conductive layer 202 can be formed as contact pads that are offset in multiple rows such that a first row of contact pads is disposed a first distance from the edge of the substrate, and a second row of contact pads alternating with the first row is disposed a second distance from the edge of the substrate. In one embodiment, conductive layer 202 is an aluminum contact pad suitable for bonding with an aluminum-wettable conductive paste or flux. Conductive post 204 is formed over conductive layer 202 to maintain standoff height during bonding.

Figure 5B:
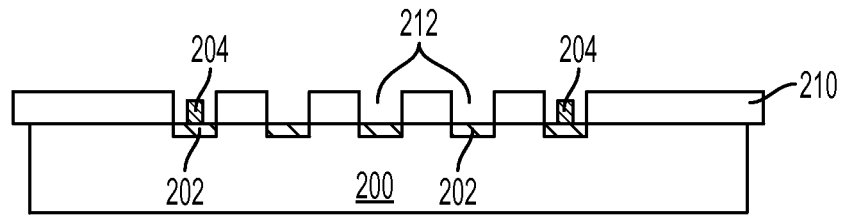

In FIG. 5b, a mask or stencil 210 is disposed over the first surface of substrate 200. Mask 210 can be an insulating layer formed using PVD, CVD, printing, spin coating, spray coating, slit coating, rolling coating, lamination, sintering or thermal oxidation. The mask 210 contains one or more layers of SiO2, Si3N4, SiON, Ta2O5, Al2O3, hafnium oxide, benzocyclobutene, polyimide, polybenzoxazoles, polymer dielectric resist with or without fillers or fibers, or other material having similar structural and dielectric properties.

Alternatively, stencil or mask 210 is formed from Al, Cu, Sn, Ni, Au, Ag, Ti, W, Pd, Pt, or other suitable material by etching, electroforming, or laser cutting to form a continuous mask with openings 212. Mask 210 has openings 212 formed in predetermined locations corresponding to conductive layer 202 of substrate 200. Mask 210 is placed over substrate 200 to cover predetermined portions of substrate 200 and expose conductive layer 202 beneath openings 212. Mask 210 has a thickness less than 200 μm. Mask 210 can be disposable or reusable for printing over a single substrate or multiple substrates, respectively, and reusable mask 210 should be cleaned between uses to prevent contamination of substrate 200.

Figure 5C:
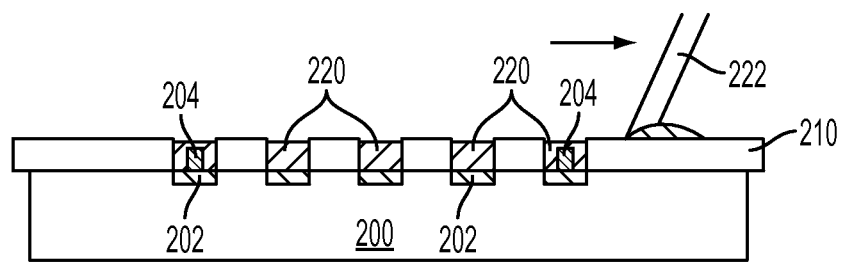

In FIG. 5c, an electrically conductive paste or spreadable conductive material 220 is deposited in openings 212 of mask 210 over conductive layer 202 using a paste printing process. Squeegee blade 222 or extrusion techniques are used to deposit conductive paste 220 into openings 212. The conductive paste can include Al, Sn, Ni, Au, Ag, Pb, Bi, Cu, solder, and combinations thereof, with an optional flux solution. For example, the paste material can be direct aluminum conductive paste or aluminum-wettable conductive paste. In one embodiment, the conductive paste is an aluminum compound comprising between 97% and 100% aluminum and a combination of silicon, copper, manganese, and chromium for improved bonding directly on aluminum contact pad 202. Conductive paste 220 is applied directly on contact pads or conductive layer 202 to form an electrical interconnection. Printing conductive paste directly on contact pads 202 allows formation of an interconnect structure with reduced cost and improved manufacturing cycle time by eliminating the need for under bump metallization and bump structures.

Figure 5D:
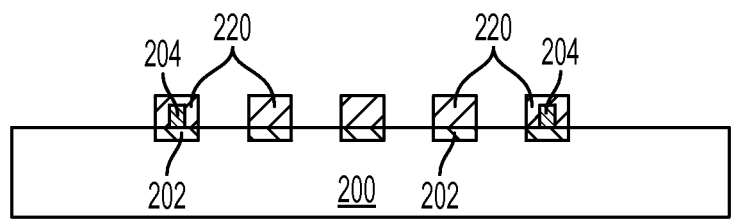

In FIG. 5d, mask 210 is removed from substrate 200 at a predetermined speed leaving conductive paste 220 over conductive layer 202 of substrate 200. Conductive paste 220 is in direct contact with contact pad 202 of substrate 200. Epoxy pre-dot 170 is formed over a surface of substrate 200 around a perimeter of contact pads 202. Epoxy pre-dot 200 has a predetermined height to maintain standoff distance between substrate 200 and semiconductor die 124 during bonding and prevent interconnect defects.

Figure 5E:
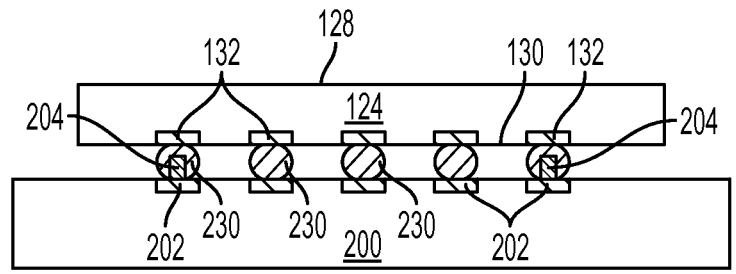

FIG. 5e illustrates flipchip semiconductor die 124 mounted over substrate 200. Prior to bonding, contact pads 132 of semiconductor die 124 can be pre-treated with plasma or chemical etching to remove any oxidation or corrosion on contact pads 132. In one embodiment, a fluoride-containing aluminum-oxide remover is used to selectively etch and remove any organic or oxidized etch residues and to control the etching of contaminated oxide surfaces. The chemical etch is carried out at ambient temperatures with process times under five minutes using immersion or spray tools. The aluminum-oxide remover has an extremely low etch rate on sensitive metals such as Cu, Al, Ti, and W. Etching conductive layer 132 eliminates electro-galvanic corrosion to improve bonding and prevent further corrosion between conductive paste 220 and conductive layer 132.

Semiconductor die 124 is disposed over substrate 200 with conductive layer 132 aligned over conductive layer 202 and conductive paste 220 between conductive layer 132 and conductive layer 202 to electrically connect substrate 200 and contact pad 132. In one embodiment, the conductive paste is reflowed by heating the material above its melting point to form interconnect structure 230. In some applications, interconnect structure 230 is reflowed a second time to improve electrical contact to conductive layers 132 and 202. In one embodiment, interconnect structure 230 is formed directly on contact pads 132 and 202 by reflowing the aluminum-wettable paste between the semiconductor die 124 and substrate 200. The interconnect structure 230 can also be compression bonded or thermocompression bonded to conductive layers 132 and 202. Conductive post 204 is formed over contact pad 202 of substrate 140 and within interconnect structure 230 to maintain a standoff distance during bonding and reduce defects in interconnect structure 230.

Interconnect structure 230 is formed directly on contact pads 202 and 132 by printing and reflowing aluminum-wettable conductive paste between semiconductor die 124 and substrate 200 to provide a low-cost interconnect solution. Forming interconnect structure 230 directly on contact pads 202 and 132 eliminates the need to form under bump metallization and bumps over contact pads. The process of forming interconnect structure 230 by paste printing thus provides improved manufacturing cycle time and reduced cost.

Figure 6A:
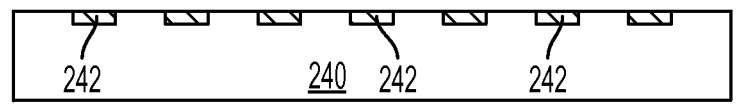
FIGS. 6a-6e illustrate flipchip interconnects formed over a substrate using paste printing directly on contact pads.

FIGS. 6a-6e illustrate forming flipchip interconnects over a substrate using paste printing to mount a semiconductor die over the substrate. In FIG. 6a, substrate 240 includes an electrically conductive layer 242 formed over the substrate using PVD, CVD, electrolytic plating, electroless plating process, or other suitable metal deposition process. Conductive layer 242 can be one or more layers of Al, Cu, Sn, Ni, Au, Ag, Ti, W, Pd, Pt, or other suitable electrically conductive material. Conductive layer 242 operates as contact pads electrically connected to the circuits or traces on substrate 240. Conductive layer 242 can be formed as contact pads disposed side-by-side a first distance from the edge of substrate 240, as shown in FIG. 6a. Alternatively, conductive layer 242 can be formed as contact pads that are offset in multiple rows such that a first row of contact pads is disposed a first distance from the edge of the substrate, and a second row of contact pads alternating with the first row is disposed a second distance from the edge of the substrate. In one embodiment, conductive layer 242 is an aluminum contact pad suitable for bonding with an aluminum-wettable conductive paste or flux.

Figure 6B:
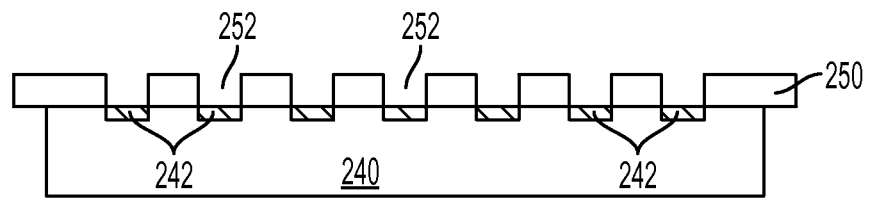

In FIG. 6b, a mask or stencil 250 is disposed over the first surface of substrate 240. Mask 250 can be an insulating layer formed using PVD, CVD, printing, spin coating, spray coating, slit coating, rolling coating, lamination, sintering or thermal oxidation. The mask 250 contains one or more layers of $SiO_2$, $Si_3N_4$, SiON, $Ta_2O_5$, $Al_2O_3$, hafnium oxide, benzocyclobutene, polyimide, polybenzoxazoles, polymer dielectric resist with or without fillers or fibers, or other material having similar structural and dielectric properties.

Alternatively, stencil or mask 250 is formed from Al, Cu, Sn, Ni, Au, Ag, Ti, W, Pd, Pt, or other suitable material by etching, electroforming, or laser cutting to form a continuous mask with openings 252. Mask 250 has openings 252 formed in predetermined locations corresponding to conductive layer 242 of substrate 240. Mask 250 is placed over substrate 240 to cover predetermined portions of substrate 240 and expose conductive layer 242 beneath openings 252. Mask 250 has a thickness less than 200 μm. Mask 250 can be disposable or reusable for printing over a single substrate or multiple substrates, respectively, and reusable mask 250 should be cleaned between uses to prevent contamination of substrate 240.

Figure 6C:
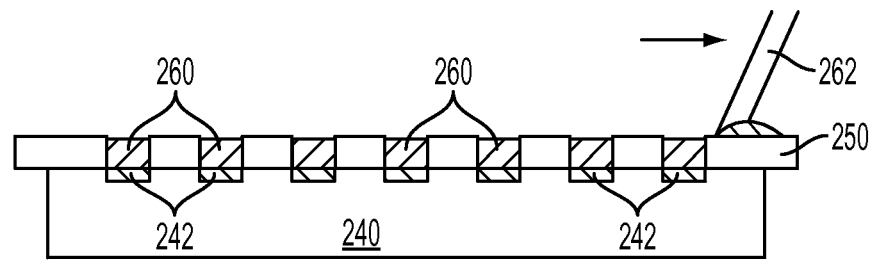

In FIG. 6c, an electrically conductive paste or spreadable conductive material 260 is deposited in openings 252 of mask 250 over conductive layer 242 using a paste printing process. Squeegee blade 262 or extrusion techniques are used to deposit conductive paste 260 into openings 252. The conductive paste can include Al, Sn, Ni, Au, Ag, Pb, Bi, Cu, solder, and combinations thereof, with an optional flux solution. For example, the paste material can be direct aluminum conductive paste or aluminum-wettable conductive paste. In one embodiment, the conductive paste is an aluminum compound comprising between 97% and 100% aluminum and a combination of silicon, copper, manganese, and chromium for improved bonding directly on aluminum contact pad 242. Conductive paste 260 is applied directly on contact pads or conductive layer 242 to form an electrical interconnection. Printing conductive paste directly on contact pads 242 allows formation of an interconnect structure with reduced cost and improved manufacturing cycle time by eliminating the need for under bump metallization and bump structures.

Figure 6D:
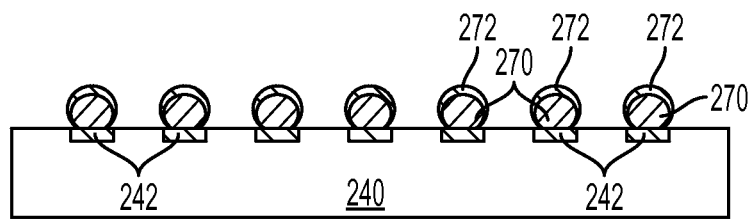

In FIG. 6d, mask 250 is removed from substrate 240 at a predetermined speed leaving conductive paste 260 over conductive layer 242 of substrate 240. Conductive paste 260 is in direct contact with contact pad 242 of substrate 240. Conductive paste 260 is reflowed over contact pads 242 to form a solder-on-pad (SOP) interconnect structure 270. Flux material 272 is applied onto SOP interconnect structure 270 to improve bonding between interconnect structure 270 and a semiconductor die. In one embodiment, flux material 272 is an aluminum-wettable flux material to improve bonding with aluminum contact pads.

Figure 6E:
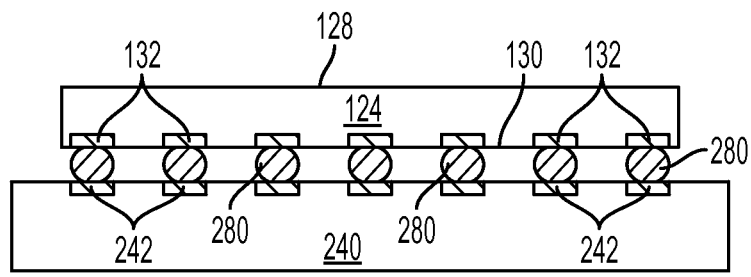

FIG. 6e illustrates flipchip semiconductor die 124 mounted over substrate 240. Prior to bonding, contact pads 132 of semiconductor die 124 can be pre-treated with plasma or chemical etching to remove any oxidation or corrosion on contact pads 132. In one embodiment, a fluoride-containing aluminum-oxide remover is used to selectively etch and remove any organic or oxidized etch residues and to control the etching of contaminated oxide surfaces. The chemical etch is carried out at ambient temperatures with process times under five minutes using immersion or spray tools. The aluminum-oxide remover has an extremely low etch rate on sensitive metals such as Cu, Al, Ti, and W. Etching conductive layer 132 eliminates electro-galvanic corrosion to improve bonding and prevent further corrosion between conductive paste 250 and conductive layer 132.

Semiconductor die 124 is disposed over substrate 240 with conductive layer 132 aligned over conductive layer 242 and conductive paste 250 between conductive layer 132 and conductive layer 242 to electrically connect substrate 240 and contact pad 132. In one embodiment, the conductive paste is reflowed by heating the material above its melting point to form interconnect structure 280. In some applications, interconnect structure 280 is reflowed a second time to improve electrical contact to conductive layers 132 and 242. In one embodiment, interconnect structure 280 is formed directly on contact pads 132 and 242 by reflowing the aluminum-wettable paste between the semiconductor die 124 and substrate 240. The bumps can also be compression bonded or thermo-compression bonded to conductive layers 132 and 242.

Interconnect structure 280 is formed directly on contact pads 242 and 132 by printing and reflowing aluminum-wettable conductive paste between semiconductor die 124 and substrate 240 to provide a low-cost interconnect solution. Forming interconnect structure 280 directly on contact pads 242 and 132 eliminates the need to form under bump metallization and bumps over the contact pads of a semiconductor die. The process of forming interconnect structure 280 by paste printing thus provides improved manufacturing cycle time and reduced cost.

Figure 7:
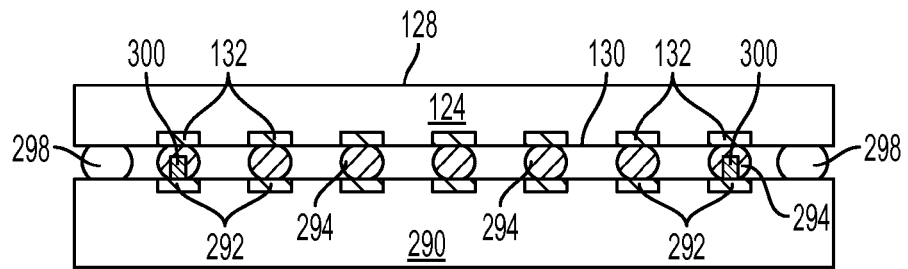
FIG. 7 illustrates a flipchip device bonded to a substrate with conductive paste in direct contact with contact pads.

FIG. 7 illustrates a flipchip semiconductor device similar to the device of FIGS. 6a-6e. Substrate 290 includes conductive layer 292 with interconnect structure 294 formed using paste printing to deposit conductive paste that is reflowed to form interconnect structure 294. Interconnect structure 294 electrically connects contact pads 292 of substrate 290 to contact pads 132 of semiconductor die 124. Epoxy pre-dot 298 is formed over a surface of substrate 290 around a perimeter of contact pads 292. Epoxy pre-dot 298 has a predetermined height to maintain standoff distance between substrate 290 and semiconductor die 124 during bonding and prevent defects in interconnect structure 294. Conductive post 300 is formed over contact pad 292 of substrate 290 and within interconnect structure 294 to maintain a standoff distance during bonding and reduce defects in interconnect structure 294.

Interconnect structure 294 is formed directly on contact pads 292 and 132 by printing conductive paste and reflowing the conductive paste and an aluminum-wettable flux between semiconductor die 124 and substrate 290 to provide a low-cost interconnect solution. Forming interconnect structure 294 directly on contact pads 292 and 132 eliminates the need to form under bump metallization and bumps over the contact pads of a semiconductor die or substrate. The process of forming interconnect structure 294 by paste printing thus provides improved manufacturing cycle time and reduced cost.

Figure 8A:
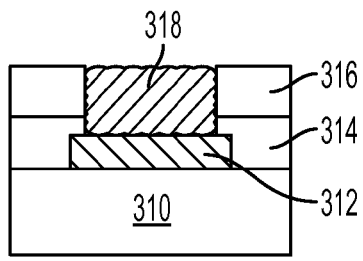
FIGS. 8a-8f illustrate further detail of the flipchip interconnects of FIGS. 6a-6e, formed using paste printing directly on contact pads.

FIGS. 8a-8f illustrate forming the flipchip interconnect structure of FIGS. 6a-6e over a substrate using paste printing to mount a semiconductor die over the substrate. In FIG. 8a, substrate 310 includes an electrically conductive layer 312 formed over the substrate using PVD, CVD, electrolytic plating, electroless plating process, or other suitable metal deposition process. Conductive layer 312 can be one or more layers of Al, Cu, Sn, Ni, Au, Ag, Ti, W, Pd, Pt, or other suitable electrically conductive material. Conductive layer 312 operates as contact pads electrically connected to the circuits or traces on substrate 310. Conductive layer 312 can be formed as contact pads disposed side-by-side a first distance from the edge of substrate 310, as shown in FIG. 8a. Alternatively, conductive layer 312 can be formed as contact pads that are offset in multiple rows such that a first row of contact pads is disposed a first distance from the edge of the substrate, and a second row of contact pads alternating with the first row is disposed a second distance from the edge of the substrate. In one embodiment, conductive layer 312 is an aluminum contact pad suitable for bonding with an aluminum-wettable conductive paste or flux.

An insulating or passivation layer 314 is formed over the first surface of substrate 310 and conductive layer 312 using PVD, CVD, printing, spin coating, spray coating, slit coating, rolling coating, lamination, sintering or thermal oxidation. Insulating layer 314 contains one or more layers of SiO2, Si3N4, SiON, Ta2O5, Al2O3, hafnium oxide, benzocyclobutene, polyimide, polybenzoxazoles, polymer dielectric resist with or without fillers or fibers, or other material having similar structural and dielectric properties.

A mask or stencil 316 is disposed over the upper surface of substrate 310. Mask 316 can be an insulating layer formed using PVD, CVD, printing, spin coating, spray coating, slit coating, rolling coating, lamination, sintering or thermal oxidation. The mask 316 contains one or more layers of SiO2, Si3N4, SiON, Ta2O5, Al2O3, hafnium oxide, benzocyclobutene, polyimide, polybenzoxazoles, polymer dielectric resist with or without fillers or fibers, or other material having similar structural and dielectric properties.

Alternatively, stencil or mask 316 is formed from Al, Cu, Sn, Ni, Au, Ag, Ti, W, Pd, Pt, or other suitable material by etching, electroforming, or laser cutting to form a continuous mask with openings. Mask 316 has openings formed in predetermined locations corresponding to conductive layer 312 of substrate 310. Mask 316 is placed over substrate 310 to cover predetermined portions of substrate 310 and expose conductive layer 312 beneath the openings. Mask 316 has a thickness less than 200 μm. Mask 316 can be disposable or reusable for printing over a single substrate or multiple substrates, respectively, and reusable mask 316 should be cleaned between uses to prevent contamination of substrate 310.

An electrically conductive paste or spreadable conductive material 318 is deposited in the openings of mask 316 over conductive layer 312 using a paste printing process. Squeegee blade 262 or extrusion techniques are used to deposit conductive paste 318 into openings. The conductive paste can include Al, Sn, Ni, Au, Ag, Pb, Bi, Cu, solder, and combinations thereof, with an optional flux solution. For example, the paste material can be direct aluminum conductive paste or aluminum-wettable conductive paste. In one embodiment, the conductive paste is an aluminum compound comprising between 97% and 100% aluminum and a combination of silicon, copper, manganese, and chromium for improved bonding directly on aluminum contact pad 312. Conductive paste 318 is applied directly on contact pads or conductive layer 312 to form an electrical interconnection. Printing conductive paste directly on contact pads 312 allows formation of an interconnect structure with reduced cost and improved manufacturing cycle time by eliminating the need for under bump metallization and bump structures.

Figure 8B:
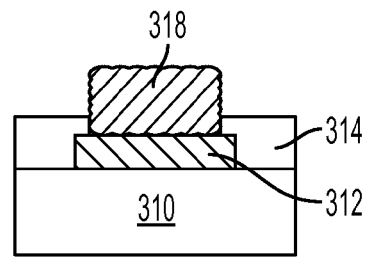
Figure 8C:
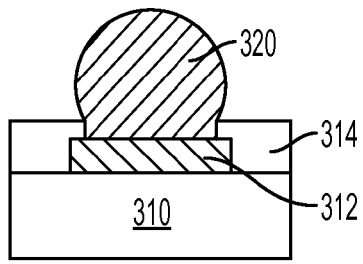
Figure 8D:
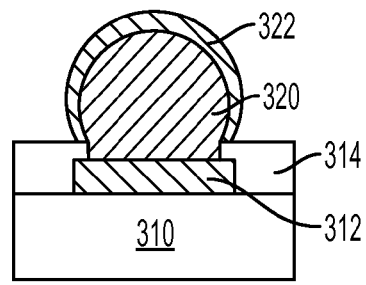

In FIG. 8b, mask 316 is removed from substrate 310 at a predetermined speed leaving conductive paste 318 over conductive layer 312 of substrate 310. Conductive paste 318 is in direct contact with contact pad 312 of substrate 310. In FIG. 8c, conductive paste 318 is reflowed by heating the material above its melting point to form SOP interconnect structure 320. In some applications, SOP interconnect structure 320 is reflowed a second time to improve electrical contact to conductive layer 312. In one embodiment, SOP interconnect structure 320 is formed directly on contact pad 312 by reflowing the aluminum-wettable paste over substrate 310. In FIG. 8d, a flux material is deposited over SOP interconnect structure 320 to improve bonding between interconnect structure 320 and a semiconductor die. In one embodiment, flux material 322 is an aluminum-wettable flux material to improve bonding with an aluminum contact pad.

Figure 8E:
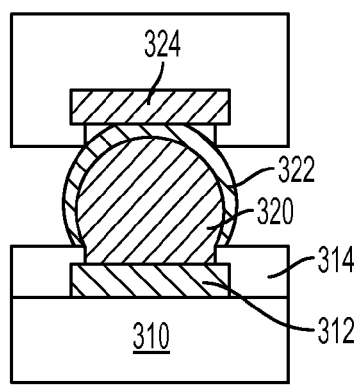
Figure 8F:
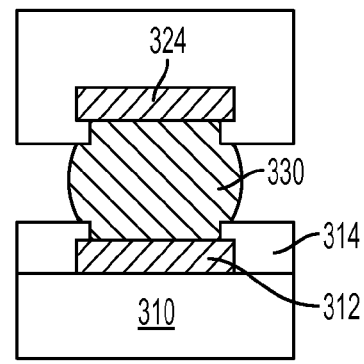

FIG. 8e illustrates a flipchip semiconductor die mounted over substrate 310. Prior to bonding, contact pads 324 of the semiconductor die can be pre-treated with plasma or chemical etching to remove any oxidation or corrosion on contact pads 324. In one embodiment, a fluoride-containing aluminum-oxide remover is used to selectively etch and remove any organic or oxidized etch residues and to control the etching of contaminated oxide surfaces. The chemical etch is carried out at ambient temperatures with process times under five minutes using immersion or spray tools. The aluminum-oxide remover has an extremely low etch rate on sensitive metals such as Cu, Al, Ti, and W. Etching conductive layer 132 eliminates electro-galvanic corrosion to improve bonding and prevent further corrosion between conductive paste 318 and conductive layer 132.

A semiconductor die is disposed over substrate 310 with conductive layer 324 aligned over conductive layer 312 and conductive paste 318 between conductive layer 324 and conductive layer 312 to electrically connect substrate 310 and contact pad 324. Interconnect structure 320 with flux material 322 is reflowed by heating the material above its melting point to form interconnect structure 330. In some applications, interconnect structure 330 is reflowed a second time to improve electrical contact to conductive layers 324 and 312.

Interconnect structure 330 is formed directly on contact pads 324 and 312 by printing conductive paste and reflowing the conductive paste and an aluminum-wettable flux between the semiconductor die and substrate 310 to provide a low-cost interconnect solution. Forming interconnect structure 330 directly on contact pads 324 and 312 eliminates the need to form under bump metallization and bumps over the contact pads of a semiconductor die. The process of forming interconnect structure 330 by paste printing thus provides improved manufacturing cycle time and reduced cost.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate;
    disposing a mask over the substrate;
    printing a conductive paste through the mask and over contact pads of the substrate;
    forming an epoxy pre-dot over the substrate;
    disposing a semiconductor die over the conductive paste; and
    reflowing the conductive paste to form an interconnect structure over the contact pads of the substrate while the epoxy pre-dot maintains a separation between the semiconductor die and substrate.

2. The method of claim 1, wherein the conductive paste and contact pads of the substrate include aluminum.

3. The method of claim 1, further including:
    disposing contact pads of the semiconductor die over the conductive paste; and
    reflowing the conductive paste to form the interconnect structure between the contact pads of the semiconductor die and the contact pads of the substrate.

4. The method of claim 3, wherein the interconnect structure is formed directly on the contact pads of the substrate and directly on the contact pads of the semiconductor die.

5. The method of claim 3, further including etching the contact pads of the semiconductor die.

6. A method of making a semiconductor device, comprising:
    providing a substrate;
    disposing a mask over the substrate;
    depositing a spreadable conductive material over the substrate;
    removing the mask;
    disposing a semiconductor die over the spreadable conductive material; and
    reflowing the spreadable conductive material to form an interconnect structure over the substrate.

7. The method of claim 6, wherein the substrate includes contact pads comprising aluminum.

8. The method of claim 7, further including:
    disposing contact pads of the semiconductor die over the spreadable conductive material; and
    reflowing the spreadable conductive material to form the interconnect structure between the contact pads of the semiconductor die and contact pads of the substrate.

9. The method of claim 8, wherein the interconnect structure is formed directly on the contact pads of the substrate and directly on the contact pads of the semiconductor die.

10. The method of claim 8, further including etching the contact pads of the semiconductor die prior to reflowing the spreadable conductive material.

11. The method of claim 6, further including forming an epoxy pre-dot over the substrate to maintain a separation between the semiconductor die and substrate while reflowing the spreadable conductive material.

12. The method of claim 6, further including forming a conductive post over a contact pad of the substrate to maintain a separation between the semiconductor die and substrate.

13. A method of making a semiconductor device, comprising:
    providing a substrate;
    depositing a conductive material on the substrate;
    disposing a semiconductor die on the conductive material;
    reflowing the conductive material to form an interconnect structure; and
    forming an epoxy pre-dot over the substrate to maintain a separation between the semiconductor die and substrate while reflowing the conductive material.

14. The method of claim 13, further including depositing the conductive material on aluminum contact pads of the substrate.

15. The method of claim 14, further including:
   disposing contact pads of the semiconductor die over the conductive material; and
   reflowing the conductive material to form the interconnect structure between the contact pads of the semiconductor die and the contact pads of the substrate.

16. The method of claim 15, wherein the interconnect structure is formed directly on the contact pads of the substrate and directly on the contact pads of the semiconductor die.

17. The method of claim 15, further including etching the contact pads of the semiconductor die prior to reflowing the conductive material.

18. A semiconductor device, comprising:
   a substrate;
   a conductive material deposited on contact pads of the substrate;
   a conductive post disposed over one of the contact pads of the substrate and extending into the conductive material; and
   a semiconductor die disposed on the conductive material.

19. The semiconductor device of claim 18, further including an epoxy pre-dot disposed between the semiconductor die and substrate.

20. The semiconductor device of claim 18, wherein the conductive material is deposited on a contact pad of the semiconductor device.

21. The semiconductor device of claim 18, wherein the conductive material includes aluminum.

22. The semiconductor device of claim 21, wherein the contact pads of the substrate include aluminum.

* * * * *